United States Patent [19]

Huang

[11] Patent Number: 5,394,358
[45] Date of Patent: Feb. 28, 1995

[54] SRAM MEMORY CELL WITH TRI-LEVEL LOCAL INTERCONNECT

[75] Inventor: Tiao-Yuan Huang, Cupertino, Calif.

[73] Assignee: VLSI Technology, Inc., San Jose, Calif.

[21] Appl. No.: 219,693

[22] Filed: Mar. 28, 1994

[51] Int. Cl.$^6$ ............................................. G11C 11/40
[52] U.S. Cl. .................... 365/182; 365/180; 257/903; 257/401
[58] Field of Search .............. 365/180, 182, 154; 257/327, 369, 371, 383, 393, 401, 903

[56] References Cited

U.S. PATENT DOCUMENTS

| | | | |
|---|---|---|---|
| 4,794,561 | 12/1988 | Hsu ...................................... | 365/182 |
| 4,890,141 | 12/1989 | Tang et al. ........................... | 257/903 |
| 5,128,731 | 7/1992 | Lien et al. ............................ | 257/369 |
| 5,166,902 | 11/1992 | Silver .................................. | 365/182 |

OTHER PUBLICATIONS

Tang, Thomas, Che-Chia Wei, Roger Haken, Thomas Holloway, Chang-Feng Wan, and Monte Douglas, "VLSI Local Interconnect Level Using Titanium Nitride" *IEDM* 1985, pp. 590-593.

*Primary Examiner*—Eugene R. LaRoche
*Assistant Examiner*—Tan Nguyen
*Attorney, Agent, or Firm*—Clifton L. Anderson

[57] ABSTRACT

A CMOS SRAM cell includes "true" and "false" NMOS word-line access transistors, "true" and "false" NMOS pull-down transistors, and "true" and "false" PMOS pull-down transistors arranged in a classical six-transistor SRAM electrical configuration. "True" and "false" inter-level interconnects of silicidable material provide for respective five-way connections among the transistors. The "true" inter-level interconnect connects: the drain of the "true" pull-up transistor, a gate level polysilicon conductor defining and connecting the gates of the "false" pull-up transistor and the "false" pull-down transistor, and a diffusion region defining and connecting the source of the "true" access transistor and the drain of the "true" pull-down transistor. In a complementary fashion, the "false" inter-level interconnect connects: the drain of the "false" pull-up transistor, a gate level polysilicon conductor defining and connecting the gates of the "true" pull-up transistor and the "true" pull-down transistor, and a diffusion region defining and connecting the drain of the "false" access transistor and the drain of the "false" pull-down transistor. These two five-way connections provide all the necessary local interconnections for the memory cell. The reduced number of inter-level local interconnects required provides for denser memory cell layouts.

4 Claims, 2 Drawing Sheets

SRAM MEMORY CELL WITH TRI-LEVEL LOCAL INTERCONNECT

BACKGROUND OF THE INVENTION

The present invention relates to integrated circuits and, more particularly, to static random access memory (SRAM) cell design. A major objective of the present invention is to provide for denser SRAM memory circuits.

Much of modern progress is associated with the increasing miniaturization of integrated circuits made possible by advances in semiconductor processing technology.. This miniaturization has provided integrated circuits of greater functionality, due in part to the greater number of circuits per integrated circuit, and greater speed, due in part to shorter distances between circuit elements.

The transistor is the most pervasive circuit element in integrated circuits, serving as switches, amplifiers and detectors. Both MOSFET and bipolar technologies can be used to fabricate transistors. Of the two, MOSFET technology is more prevalent because of its lower power requirements. Lower power means less problem with heat dissipation, which looms as a major concern as circuits become increasingly dense. In addition, lower power provides for longer battery lifetimes in portable devices.

A MOSFET includes a source, a drain, a channel, a gate, and an insulator electrically isolating the gate and the channel. Typically, the source and drain are commonly doped semiconductor regions separated by the channel. The voltage at the gate controls the conductivity of the channel, and thus the flow of current between the source and the drain.

"MOSFET" stands for "metal-oxide-silicon field-effect transistor". The "field effect" is the effect of the field induced by the gate voltage on the channel conductivity. "Metal-oxide-silicon" describes the gate structure for transistors in which metal is used for the conductive gate. Since doped polysilicon is the prevalent gate material today, "MOS" can be considered a well-established misnomer.

The earliest MOS transistors were PMOS transistors, which have positively-doped (p-type) sources and drains. Subsequently, NMOS transistors, which have negatively-doped (n-type) sources and drains have become more prevalent. CMOS technology utilizes both NMOS and PMOS transistors to provide circuits with exceptionally low power requirements. Most recently, BiCMOS technology combines bipolar, NMOS and PMOS transistors on a single integrated circuit to make the most of the advantages of each transistor type.

While modern CMOS circuits no longer use metal gates, metal is still the prevalent interconnect material between transistors. Layers of interconnect metal, such as aluminum, are used to define the functional connections among transistors. At least two levels of metal are usually required to provide cross-overs. Depending on the routing complexity, additional metal layers can be required. Insulating layers, for example of silicon dioxide, electrically isolate the metal layers from each other and from underlying local interconnects and transistor source/drain regions. Metal vias are formed through the insulating layers to provide for electrical connections among the metal and local interconnects and source/drain regions.

While not as conductive as metal, doped silicon and polysilicon can be used for local electrical connections to reduce the number and the complexity of the metal layers and to reduce the number of vias required. The resistivity of these interconnects can be reduced by forming silicide on the doped silicon and polysilicon interconnects. For example, titanium can be deposited over the conductor. The titanium can then be heated, causing the titanium to react with the silicon to form a silicide.

Since the silicide only forms on silicon and not on silicon dioxide, the silicide is self-aligning. Self-aligned features are distinguished from features that rely on the proper registration of successive photolithography masks for alignment. Silicide contacts are not subject to mask misregistration, and thus provide for more precise feature location and increased circuit density.

The silicide is typically formed in a nitrogen ambient to prevent unwanted oxidation. Titanium not in contact with silicon is converted to titanium nitride. This titanium nitride is typically etched away during silicide processing.

However, since titanium nitride is conductive, it can be patterned to provide local interconnections as disclosed in "VLSI Local Interconnect Level Using Titanium Nitride" by Thomas Tang, Che-Chia Wei, Roger Haken, Thomas Holloway, Chang-Feng Wan, and Monte Douglas, IEDM, 1985, pp. 590–593. Tang et al. discloses novel layouts for an inverter and a six-transistor CMOS SRAM cell. The inverter uses titanium-nitride to connect a polysilicon local interconnect to the respective drains of a PMOS transistor and an NMOS transistor. The memory cell also uses titanium nitride interconnects to connect gate polysilicon to source/drain regions. The resulting memory cell, illustrated in FIG. 7b of Tang et al., consumes about 20% less area than the comparable conventional memory cell, illustrated in FIG. 7a.

The disclosed six-transistor cell employs five titanium nitride local interconnects, each electrically connecting a transistor gate to an active region (source or drain) of another transistor. Accordingly, there are a total of 10 silicide contacts. In addition, substrate diffusion and polysilicon local interconnects are employed.

While the silicide contacts are self-aligning, the titanium nitride is subject to mask misregistration. To minimize misalignment, titanium nitride interconnects can be made larger. In this event, however, the titanium-nitride interconnects themselves impose a limit on further improvements in circuit density. In addition, silicide contacts can fail. Having a large number of silicide contacts per cell can reduce manufacturing yields, and thus increase the costs of the integrated circuits.

Since many integrated circuits include very large numbers of SRAM cells, any reduction of cell dimensions can yield large benefits in terms of overall circuit density. What is needed is a memory cell design that can provide for greater circuit densities. In addition, improved circuit reliability and lower circuit costs are desired.

SUMMARY OF THE INVENTION

The present invention provides for a six-transistor SRAM memory cell with a tri-level local interconnect structure. In this tri-level structure, two inter-level interconnects connect respective polysilicon inter-gate connectors to respective source/drain regions and to respective interconnecting diffusion regions. Thus, each inter-level interconnect provides connections among five transistors.

The present invention can be applied to the conventional CMOS SRAM design with two NMOS pull-down transistors, two PMOS pull-up transistors, and two NMOS access transistors. A first n-type diffusion region of the substrate defines the drain for a first pull-down transistor and the source for a first access transistor so that the two active regions are electrically connected. A second n-type diffusion region of the substrate defines the drain for the second pull-down transistor and a drain for the second access transistor so that these two active regions are electrically connected. A p-type region of the substrate defines the sources for the two pull-up transistors, connecting them to $V_{DD}$. Other sources and drains have doped regions; i.e., they are not electrically connected to other sources and drains at the substrate level.

The gate layer, typically polysilicon, provides two inter-gate conductors. A first inter-gate conductor defines and electrically connects the gates of the first pull-up transistor and the first pull-down transistor. A second inter-gate conductor defines and electrically connects the gates of the second pull-up transistor and the second pull-down transistor. Separate gates are provided for the access transistors; these gates are connected to receive a word line signal.

The inter-level interconnect layer provides two conductors, each of which completes a five-way connection among transistor elements. The first conductor connects the drain of the first pull-up transistor with: the first diffusion region, providing connection to the drain of the first pull-down transistor and the source of the first access transistor; and the second gate conductor, providing access to the gates of the second pull-down transistor and the second pull-up transistor. Similarly, the second conductor connects the drain of the second pull-up transistor with: the second diffusion region, providing connection to the drain of the second pull-down transistor and the drain of the second access transistor; and the first gate conductor, providing access to the gates of the first pull-down transistor and the first pull-up transistor.

Alternatively, for either access transistor, the roles of the source and the drain can be reversed in the above description. Less conventionally, either or both of the access transistors can be PMOS rather than NMOS. In the case of PMOS access transistors, one of its source/drain regions is electrically connected by the respective diffusion region to the drain of the respective pull-up transistor, rather than to the drain of the respective pull-down transistor.

Preferably, the substrate is silicon and the gate material is polysilicon. The inter-level connect layer can be of titanium nitride or other material used to form silicides. The metal interconnect layers can include aluminum or aluminum copper conductors.

The present invention requires only two inter-level connect layer conductors to complete a six-transistor memory cell. Each contact layer conductor makes three connections, for a total of six silicide contacts. This contrasts with the 5 contact layer conductors with two connections each for a total of 10 silicide contacts disclosed by Tang et al. As a result of the reduction of the number of contacts, much less circuit area is required for tolerances. The reduced number of contacts improves manufacturing yield. Thus, the present invention provides for smaller and less expensive memory devices than those provided for by the prior art. These and other features and advantages of the present invention are apparent from the description below with reference to the following drawings.

DESCRIPTION OF THE PREFERRED EMBODIMENTS

Figure 1:
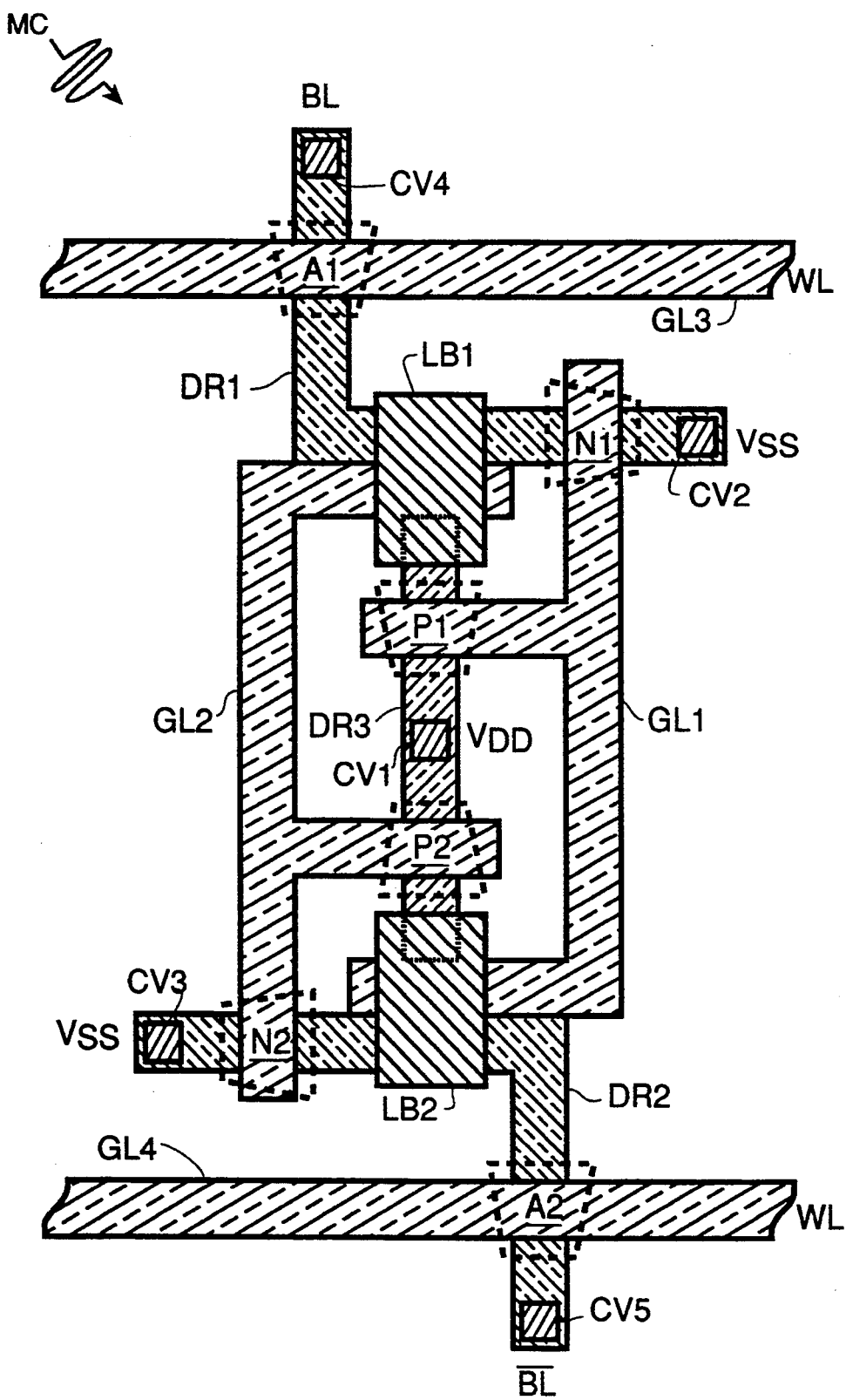
FIG. 1 is a schematic plan view of a CMOS SRAM memory cell in accordance with the present invention. Transistors are represented as trapezoids: the narrow trapezoid end locates the transistor source, while the wide trapezoid end represents the transistor drain.

In accordance with the present invention, a memory cell MC comprises six transistors and their interconnections as illustrated in FIG. 1. The six transistors are a first access transistor A1, a second access transistor A2, a first pull-up transistor P1, a second pull-up transistor P2, a first pull-down transistor N1, and a second pull-down transistor N2. The pull-up transistors P1 and P2 are PMOS transistors, while the other transistors A1, A2, N1, and N2 are NMOS transistors.

A first L-shaped n-type silicided diffusion region DR1 not only defines the source for transistor A1 and the drain for transistor N1, but also provides for their electrical connection. A second L-shaped n-type silicided diffusion region DR2 not only defines the drain for transistor A2 and the drain for transistor N2, but also provides for their electrical connection. A linear p-type substrate region DR3 not only provides the sources for pull-up transistors P1 and P2, but provides for their electrical connection.

A polysilicon layer provides four conductors GL1–GL4. F-shaped inter-gate conductor GL1 provides the gates for transistors N1 and P1, electrically connecting these gates. F-shaped inter-gate conductor GL2 provides the gates for transistors N2 and P2, electrically connecting these gates. Conductor GL3 defines the gate for transistor A1, while conductor GL4 defines the gate for transistor A2.

An inter-level interconnect layer provides two level-bridging interconnect structures LB1 and LB2. Each of these structures is: titanium nitride over silicon dioxide; and a composite of titanium nitride and titanium silicide sublayers over silicon. Inter-level interconnect LB1 connects the p-type drain of transistor P1 to n-type substrate region DR1 and gate layer conductor GL2. Thus, a five-way connection is made between the P1 drain, the A1 source, the N1 drain, the N2 gate, and the P2 gate. Inter-level interconnect LB2 connects the p-type drain of transistor P2 to n-type substrate region DR2 and gate layer conductor GL1. Thus, a five way connection is made between the P2 drain, the A2 drain, the N2 drain, the N1 gate, and the P1 gate.

A metal interconnect structure provides signal and power interfacing between memory cell MC and external circuits. The metal interconnect structure includes two metalization layers and contact vias CV1–CV5. Contact via CV1 supplies a voltage $V_{DD}$ to substrate region DR3, and thus to the sources of transistors P1 and P2. Contact via CV2 connects a voltage $V_{SS}$ to the source of transistor N1, while contact via CV3 connects voltage $V_{SS}$ to the source of transistor N2. Contact via CV4 connects a bit-line BL to the drain of transistor A1. Contact via CV5 connects the complementary bit line $\overline{BL}$ to the source of transistor A2. (BL and $\overline{BL}$ can also be referred to respectively as "true" and "false" bit lines.) Contact vias also provide a word line signal WL to gate layer conductors GL3 and GL4, and thus to the gates of access transistors A1 and A2. However, these contacts are shared among many memory cells, so they are not within the field of view represented by FIG. 1.

Figure 2:
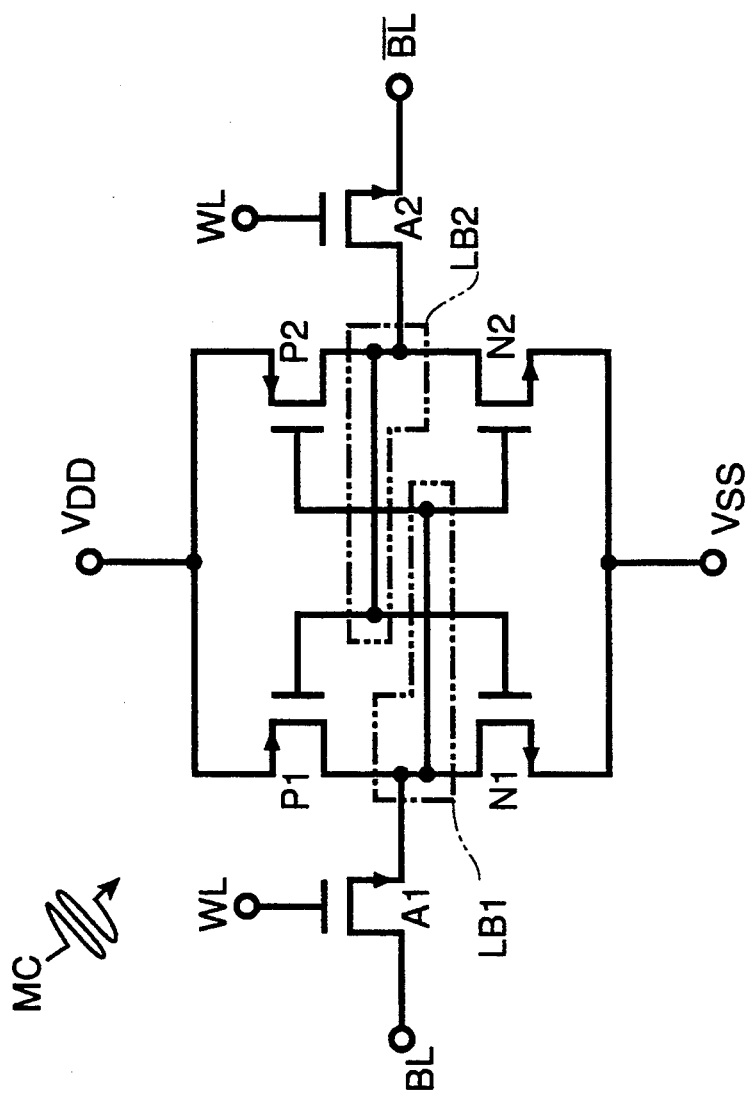
FIG. 2 is a circuit diagram for the memory cell of FIG. 1.

The circuit diagram for memory cell MC is shown in FIG. 2. Those skilled in the art will recognize that it is functionally identical to conventional six-transistor memory cells. The 5-way connections provided by contact layer conductors LB1 and LB2 are indicated in FIG. 2.

Operation of memory cell MC is conventional and is described for those not already familiar with the operation of a 6-transistor memory cell. When writing or reading data in cell MC is desired, word line WL (which is held low in the standby state) is raised to $V_{DD}$ (e.g., +5 V). This causes the enhancement-mode NMOS access transistors A1 and A2 to be turned on.

Writing is performed by forcing one of the "true" or "false" bit lines low (e.g., close to 0 V), while maintaining the other at its standby value (about 3 V). For example, to write a "true" (logic level 1), complementary bit line $\overline{BL}$ is forced low. When this occurs, when this occurs, pull-down transistor N1 turns off. The drain voltage for N1 rises due to the currents flowing through pull-up transistor P1 and access transistor A1, turning on pull-down transistor N2. Once N2 has been turned on, the bit line can be returned to its standby level, leaving the cell in the "true" state (logic level 1). The operation of writing a "false" (logic level 0) is complementary to that just described.

For reading MC while it is storing a "true" logic level 1, bit lines BL and $\overline{BL}$ are both biased at about 3 V. When the cell is selected, current flows through access transistor A2 and pull-down transistor N2 to ground and through pull up transistor P1 and access transistor A1 to "true" bit line BL. The gate voltage of pull-down transistor N2 does not fall below 3 V, so it remains on. The voltage of complementary bit line $\overline{BL}$ is thus reduced to less than 3 V, while the voltage of "true" bit line BL is pulled above 3 V, since N1 is off and P1 is on. As a result, a differential output signal exists between bit lines BL and $\overline{BL}$. This signal is fed to a sense amplifier, which is a rapid-sensing differential amplifier.

It should be noted that the access transistors are pass transistors so that there is no substantial distinction between their sources and drains. Thus, other characterizations of the invention reverse the locations of the sources and drains for the access transistors. To encompass these alternatives, each transistor can be considered as having two interchangeable source/drain regions.

In other embodiments, one or both access transistors can be PMOS. When a PMOS access transistor is used, one of its source/drain regions is electrically connected to the drain of the respective pull-up transistor, rather than to the drain of the respective pull-down transistor. In this case, the inter-level interconnect provides the connection to the drain of the respective pull-down transistor.

While the contact layer is disclosed to be titanium-based, other silicidable materials such as cobalt and nickel can be used. Alternatively, a second polysilicon layer can be used. These and other modifications to and variations upon the preferred embodiments are provided for by the present invention, the scope of which is limited only by the following claims.

What is claimed is:

1. In a six-transistor static random access memory cell comprising first and second access transistors, first and second pull-down transistors, and first and second pull-up transistors, each of said transistors having a gate and two source/drain regions, said memory cell further comprising at least 4 interconnect layers including a diffusion layer, a gate layer, an inter-level interconnect layer, and a metal remote interconnect structure, the improvement wherein:

said diffusion layer defines the source/drain regions for all six of said transistors, said diffusion layer including
a first diffusion region defining and electrically connecting a source/drain region of said first access transistor with a source/drain region of a transistor of a first set consisting of said first pull-up transistor and said first pull-down transistor, and
a second diffusion region defining and electrically connecting a source/drain region of said second access transistor with a source/drain region of a transistor of a second set consisting of said second pull-up transistor and said second pull-down transistor;

said gate layer defines the gates for all six of said transistors, said gate layer including
a first inter-gate conductor electrically connecting the gate of said first pull-up transistor and the gate of said first pull-down transistor, and
a second inter-gate conductor electrically connecting the gate of said second pull-up transistor and the gate of said second pull-down transistor; and said inter-level interconnect layer includes
a first inter-level interconnect electrically connecting said second inter-gate conductor with said first diffusion region and with a source/drain region of the transistor of said first set not defined by said first diffusion region, and
a second inter-level interconnect electrically connecting said first inter-gate conductor with said second diffusion region and with a source/drain region of the transistor of said second set not defined by said second diffusion region.

2. A memory cell as recited in claim 1 wherein said diffusion layer is defined in a crystalline silicon substrate, said gate layer is polysilicon, said diffusion interconnect layer is titanium nitride, and said metal layer is of aluminum.

3. A memory cell as recited in claim 1 wherein: said pull-down transistors and said access transistors are NMOS and said pull-up transistors are PMOS.

4. A memory cell as recited in claim 3 wherein:
said first diffusion region electrically defines and connects the source of said first access transistor with the drain of said first pull-down transistor; and
said second diffusion region electrically defines and connects the drain of said second access transistor with the drain of said second pull-down transistor.

* * * * *